US012757345B2

(12) United States Patent
Balakrishnan et al.

(10) Patent No.: US 12,757,345 B2
(45) Date of Patent: Oct. 6, 2026

(54) POWER CONVERTER USING A PLANAR ENERGY TRANSFER ELEMENT

(71) Applicant: POWER INTEGRATIONS, INC., San Jose, CA (US)

(72) Inventors: Balu Balakrishnan, Saratoga, CA (US); Marvin Ralph B. Bautista, San Jose, CA (US); David Michael Hugh Matthews, Los Gatos, CA (US); Norberto Orcullo, Renton, WA (US)

(73) Assignee: Power Integrations, Inc., San Jose, CA (US)

( * ) Notice: Subject to any disclaimer, the term of this patent is extended or adjusted under 35 U.S.C. 154(b) by 333 days.

(21) Appl. No.: 18/541,457

(22) Filed: Dec. 15, 2023

(65) Prior Publication Data

US 2025/0203799 A1 Jun. 19, 2025

(51) Int. Cl.

*H05K 7/14* (2006.01)
*H05K 1/14* (2006.01)
*H05K 1/181* (2026.01)

(52) U.S. Cl.

CPC ......... *H05K 7/14322* (2022.08); *H05K 1/144* (2013.01); *H05K 1/181* (2013.01); *H05K 7/14339* (2022.08); *H05K 2201/08* (2013.01)

(58) Field of Classification Search

CPC .......... H05K 1/02; H05K 1/0298; H05K 1/14; H05K 1/144; H05K 1/18; H05K 1/181;

(Continued)

(56) References Cited

U.S. PATENT DOCUMENTS 5,161,098 A 11/1992 Balakrishnan
5,469,344 A 11/1995 Kotsakis (Continued)

FOREIGN PATENT DOCUMENTS

DE 19802473 A1 2/1999
DE 102010029470 B4 11/2016

(Continued)

OTHER PUBLICATIONS

International Application Serial No. PCT/US2023/084793; “International Search Report and Written Opinion”; Mailed Jul. 12, 2024; 20 pages.

(Continued)

*Primary Examiner* — Tuan T Dinh
(74) *Attorney, Agent, or Firm* — Christensen O’Connor Johnson Kindness PLLC

(57) ABSTRACT

A power converter comprises a stack of circuit layers, a magnetic core, an area of the stack of circuit layers, and power converter circuit components mounted on the stack of circuit layers. The stack of circuit layers has a hole which extends through each of the circuit layers. A portion of the circuit layers form an energy transfer element that comprises an input winding and an output winding. Each winding includes at least one winding layer having a planar winding and connections for electrical connectivity. The magnetic core is positioned within the hole substantially perpendicular to the stack. The area of the stack of circuit layers encompasses the windings and connections for electrical connectivity of the input and output windings. The power converter circuit components are mounted within the area of the stack and external to the magnetic core.

16 Claims, 5 Drawing Sheets

(58) Field of Classification Search
CPC ............... H05K 7/4322; H05K 7/4339; H05K 2201/08; H02M 1/00; H02M 1/0064; H02M 3/003; H02M 3/28; H02M 3/33507; H02M 3/33569; H02M 7/003; H02M 7/043
USPC .......... 361/760–784, 795, 803; 336/137–185
See application file for complete search history.

(56) References Cited

U.S. PATENT DOCUMENTS

| | | | | |
|---|---|---|---|---|
| 6,069,548 | A | 5/2000 | Baarman et al. | |
| 6,466,454 | B1 * | 10/2002 | Jitaru | H01F 27/06 361/767 |
| 7,741,943 | B2 | 6/2010 | Fouquet et al. | |
| 7,852,635 | B1 * | 12/2010 | Busletta | H05K 3/429 174/265 |
| 8,310,327 | B2 * | 11/2012 | Willers | H01F 27/06 336/200 |
| 10,128,766 | B1 | 11/2018 | Strijker et al. | |
| 10,991,501 | B2 | 4/2021 | Eom et al. | |
| 11,120,940 | B2 | 9/2021 | Richardson | |
| 2007/0152795 | A1 * | 7/2007 | Zeng | H01F 27/2804 336/212 |
| 2008/0247195 | A1 * | 10/2008 | Nakahori | H02M 7/003 363/20 |
| 2012/0169154 | A1 | 7/2012 | Curodeau | |
| 2016/0358705 | A1 | 12/2016 | Lin et al. | |
| 2017/0200552 | A1 | 7/2017 | Chung et al. | |
| 2018/0102213 | A1 | 4/2018 | Hanabusa et al. | |
| 2018/0351462 | A1 | 12/2018 | Li et al. | |
| 2020/0203053 | A1 | 6/2020 | Scholz | |
| 2020/0271717 | A1 | 8/2020 | Nakamura et al. | |
| 2022/0255447 | A1 | 8/2022 | Zou et al. | |
| 2022/0256700 | A1 | 8/2022 | Zou et al. | |
| 2022/0399153 | A1 * | 12/2022 | Mukherjee | H01F 27/2804 |

FOREIGN PATENT DOCUMENTS

| | | | |
|---|---|---|---|
| DE | 102021119240 | A1 | 1/2023 |
| EP | 2348516 | A1 | 7/2011 |
| EP | 1756935 | B1 | 9/2016 |
| EP | 2909847 | B1 | 12/2019 |
| KR | 20160030705 | A | 3/2016 |
| WO | 2021034745 | A1 | 2/2021 |
| WO | 2023228518 | A1 | 11/2023 |

OTHER PUBLICATIONS

International Application Serial No. PCT/US2023/084793; "Invitation to Pay Additional Fees and Where Applicable, Protest Fee"; Mailed Jun. 10, 2024; 16 pages.
International Application Serial No. PCT/US2023/084810; "International Search Report and Written Opinion"; Mailed Jul. 25, 2024; 13 pages.
Zhao et al., Losses and Thermal Analysis of an Integrated PCB Coreless Axial Flux PMSM with the Drive System, IEEE Transactions on Industrial Electronics, vol. 70, No. 11, Nov. 2023, 11 pages.
European Application Serial No. 24218200.4, Extended European Search Report mailed Apr. 3, 2025; 10 pages.
International Application Serial No. PCT/US2025/012509, International Search Report and Written Opinion, Apr. 23, 2025, 20 pages.

* cited by examiner

POWER CONVERTER USING A PLANAR ENERGY TRANSFER ELEMENT

BACKGROUND

Field of the Invention

The present disclosure relates generally to power converters, and more particularly, to the packaging of power converters.

Discussion of the Related Art

Electric utilities transmit unregulated alternating current (ac), which carries electrical signals across long distances and between buildings. This transmission requires a very high voltage that most circuits, e.g., electronic devices, within houses and businesses cannot handle. The voltage needs to be stepped down to be used in those settings. Similarly, high voltage batteries are used to power the motors of electric vehicles. The voltage output of the battery needs to be stepped down to power the interior accessories, e.g., windows, radio, and navigation system. Switched mode power converters, also referred to as switching power converters, are commonly used to provide a lower voltage to many of today's electronics due to their high efficiency, small size, and low weight. The switched mode power converter converts high voltage related to the unregulated ac input, to a lower voltage related to a constant or stable direct current (dc) output also known as a regulated dc output through an energy transfer element, e.g., a transformer. The switched mode power converter usually provides dc output regulation by sensing one or more signals representative of one or more output quantities, for example, voltage, current, or the combination of the two, and controlling the output in a closed loop. In operation, a switch is turned on and off to provide the desired output by varying the duty cycle, the switching frequency, or varying the number of pulses per unit time of the switch in a switched mode power converter.

Power converters generally include one or more controllers which sense the output of the power converter and control the operation of the switch to regulate the output. These controllers generally require a regulated or unregulated voltage source to power the circuit components of the controller.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. Corresponding reference characters indicate corresponding components throughout the several views of the figures.

FIG. 3A illustrates a perspective view. FIG. 3B illustrates a side view.

Figure 1:
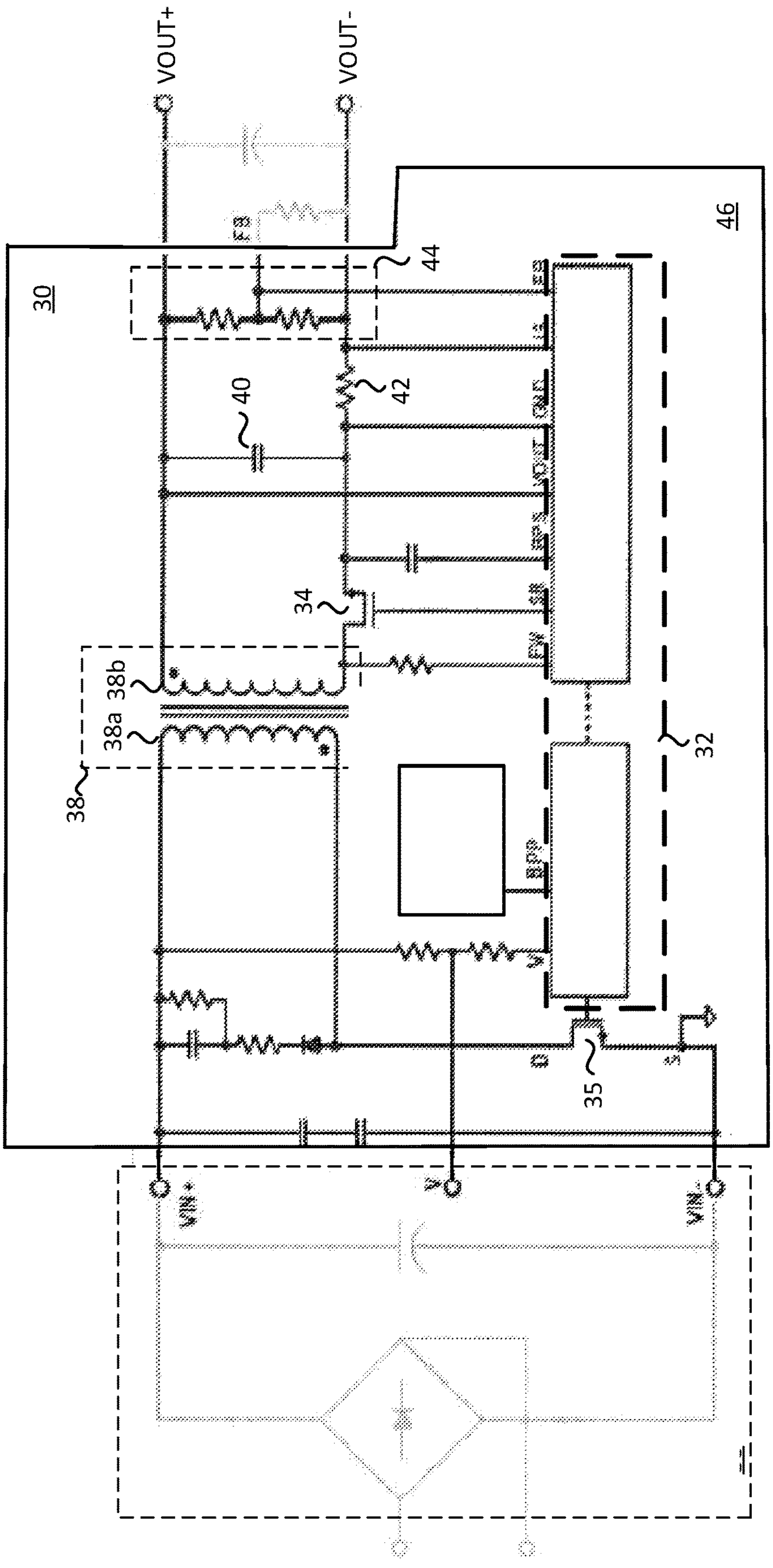
FIG. 1 illustrates a circuit schematic diagram of the circuit components for a direct current (dc)-dc power converter 30 according to the disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

A conventional power converter includes an energy transfer element, e.g., a discrete transformer having an input winding and an output winding. The discrete transformer is typically mounted onto a printed circuit board. To minimize EMI and parasitic noise from resistance, inductance, and capacitance, the transformer and any other power converter circuit components are physically separated from each other.

The embodiments disclosed are directed towards a dc-dc power converter having the power circuit components mounted on a stack of circuit layers that includes a planar energy transfer element, e.g., a planar transformer. A hole extends through each of the circuit layers. A magnetic core assembly is positioned within the hole. A portion of the stack of circuit layers includes an input winding layer and an output winding layer. Each winding layer includes a winding and connections for electrical connectivity. The power converter circuit components include input and output circuit components that are mounted within an area of the stack and external to the magnetic core. The area of the stack encompasses the winding and connections for electrical connectivity of the larger of the input and output winding layers. In an embodiment, the input circuit components may be mounted on the stack of circuit layers and electrically connected to the input winding layer. In an embodiment, the output circuit components may be mounted on the stack of circuit layers and electrically connected to the output winding layer.

FIG. 1 illustrates a circuit schematic diagram of the circuit components for a dc-dc power converter 30 according to the disclosure. A controller 32 connects to additional power converter components that include a power switch 35, a synchronous rectifier 34, and a planar energy transfer element 38, e.g., a planar transformer, a filter circuit 40, a sensing circuit 42, and a feedback circuit 44. The planar energy transfer element 38 is integrated in a stack of circuit layers 46. When the planar energy transfer element 38 is a transformer, the input winding 38*a* is a primary winding and output winding 38*b* is a secondary winding. Each of the windings includes at least one winding layer. The controller 32 and the additional power converter circuit components are positioned on the stack 46 such that they are within an area 38*c* (seen in FIG. 2) of the stack of circuit layers 46. The area 38*c* of the stack of circuit layers 46 encompasses the winding and connections for electrical connectivity of the larger of the input winding 38*a* and output winding 38*b*. An embodiment of converter 30 could optionally form part of an ac-dc converter, with the addition of a bridge rectifier and input capacitance (shown in grayscale in box 16), as would be understood by those of skill in the art.

Figure 2:
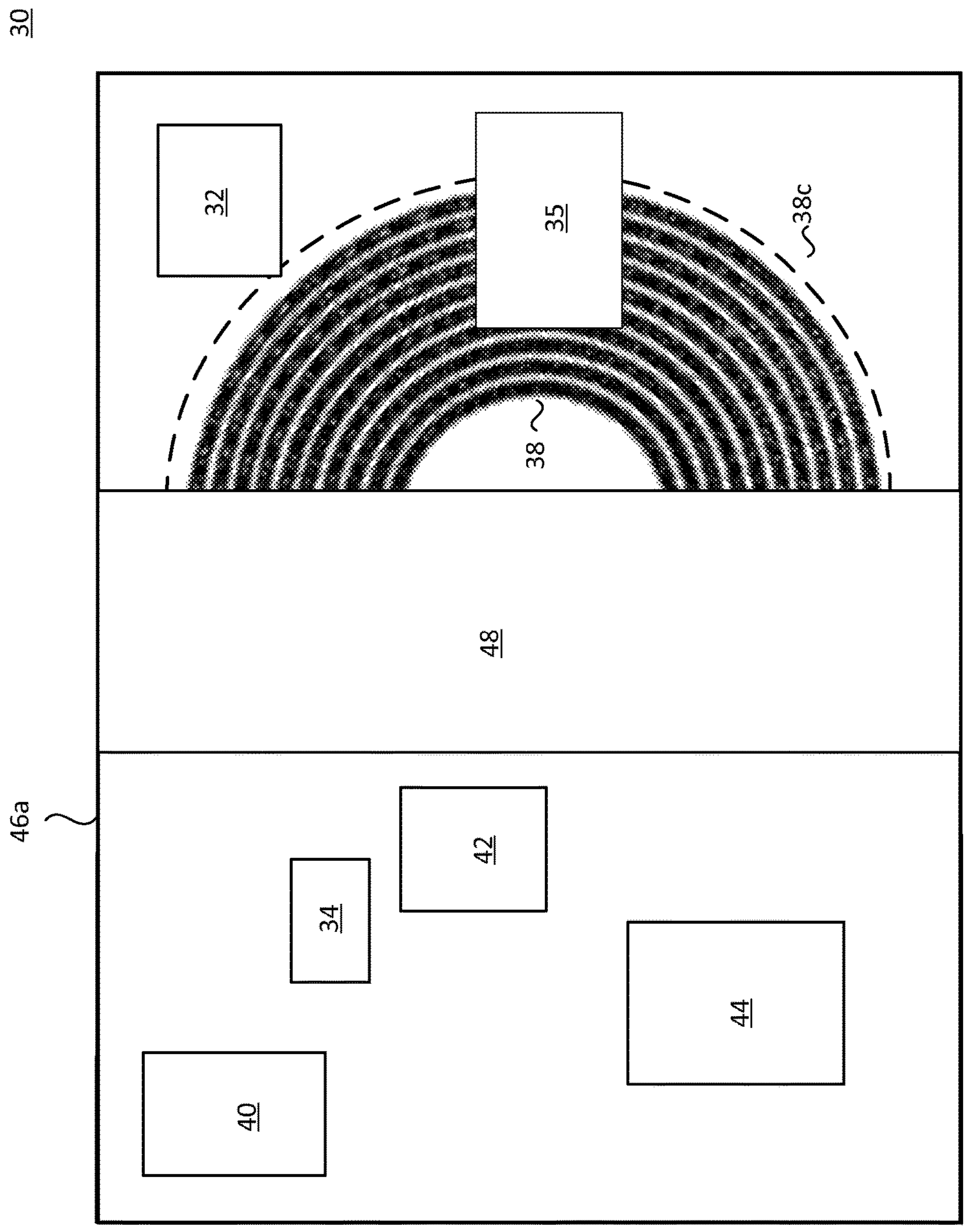
FIG. 2 is a top-down exemplary view of the layout of the dc-dc power converter 30 shown in FIG. 1 illustrating that the controller 32 and the power circuit components, are illustratively positioned within an area 38*c* of the planar energy transfer element 38 and external to a magnetic core assembly 48.

FIG. 2 is a top-down exemplary view of the layout of the dc-dc power converter 30 shown in FIG. 1 illustrating that the controller 32 and the additional power circuit components, e.g., the power switch 35, synchronous rectifier 34, the filter circuit 40, the sensing circuit 42, and the feedback circuit 44, are illustratively positioned within an area 38*c* of the planar energy transfer element 38 and external to a magnetic core assembly 48. The magnetic core assembly 48 extends through the stack of circuit layers 46. The power converter circuit components may be positioned on one of a first surface 46*a* or a second surface 46*b*, or both, of the stack of circuit layers 46. The first and second surfaces are parallel to the circuit layers. An optional housing (not shown) may surround the stack of circuit layers 46, the magnetic core assembly 48, and the power converter circuit components.

The stack of circuit layers 46 has a hole which extends through each of the circuit layers. The magnetic core assembly 48 and a portion of the stack of circuit layers 46 form a planar energy transfer element 38, e.g., a planar transformer. The portion of the stack of circuit layers 46 includes the input winding 38*a* and the output winding 38*b*. Each winding includes at least one winding layer. A winding layer includes a planar winding and connections for electrical connectivity. The planar winding may be a circular spiral or an oval spiral having one or more turns. The magnetic core assembly 48 is positioned within the hole substantially perpendicular to the stack of circuit layers 46. The area 38*c* of the planar energy transfer element 38 is coplanar with the first surface and encompasses the windings and connections for electrical connectivity of the input winding layers 38*a* and output winding layers 38*b*.

The controller 32, the input winding 38*a*, and the output winding 38*b* are electrically connected to the power converter circuit components. The controller 32 facilitates communication between the input and the output sides of the power converter.

The power converter circuit components are either input circuit components or output circuit components. In this embodiment, the power converter circuit components are mounted on the first surface 46*a*. A portion of the first surface 46*a* has been removed to show the layer that includes one layer of the input winding 38*a*. The input circuit components are mounted within the area 38*c* of the input and output windings 38*a*, 38*b* and external to the magnetic core assembly 48 and are electrically connected to the input winding 38*a*. The output circuit components are mounted within the area 38*c* of the input and output winding 38*a*, 38*b* and external to the magnetic core assembly 48 and are electrically connected to the output winding 38*b*. The input circuit components include a power switch 35. The output circuit components include a synchronous rectifier 34, a filter circuit 40, a sensing circuit 42, and a feedback circuit 44.

Figure 3A:
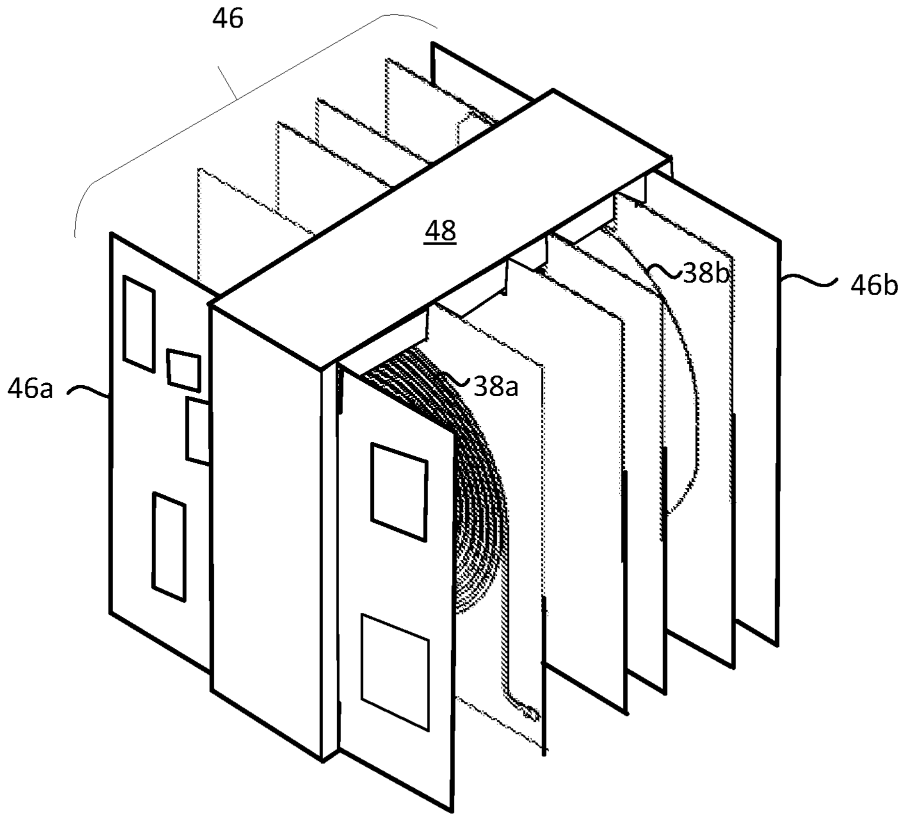
FIGS. 3A-B illustrate a power converter assembly having a two-piece E-E or E-I shaped magnetic core.
Figure 3B:
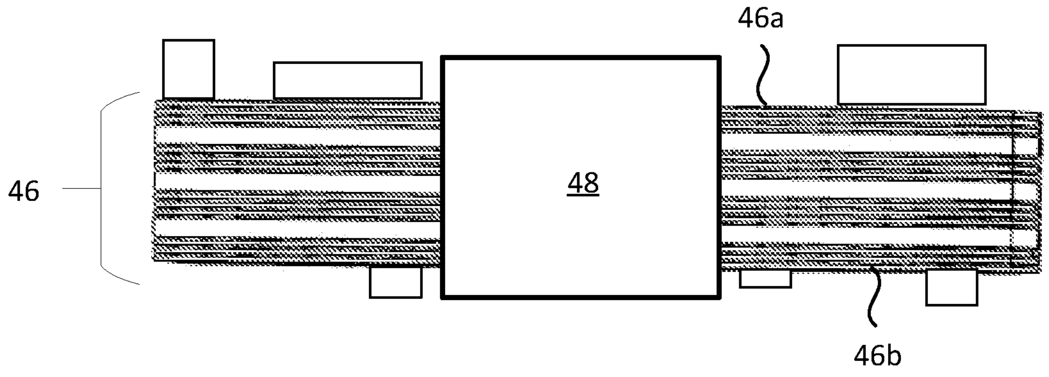

FIGS. 3A-B illustrate a power converter assembly having a two-piece E-E or E-I magnetic core. FIG. 3A illustrates a perspective view. FIG. 3B illustrates a side view.

FIG. 3A illustrates that the power converter circuit components are mounted on a first surface 46*a* and are mounted overlapping one or more portions of the windings of the input and the output windings 38*a*, 38*b*. The power converter circuit components may also be mounted overlapping one or more portions of the connections for electrical connectivity of the input and output windings 38*a*, 38*b*.

FIG. 3B illustrates that the power converter circuit components may be further mounted on a second surface 46*b* of the stack of circuit layers 46. The first and second surfaces 46*a*, 46*b* are substantially parallel to each other.

In one variation, all the power converter circuit components are mounted on the same surface of the stack and external to the magnetic core. The surface may be the first surface 46*a* or the second surface 46*b*.

In one variation, the input circuit components are mounted on one of the first surface 46*a* and the second surface 46*b*, and the output circuit components are mounted on the other of the first surface 46*a* and the second surface 46*b*.

In one variation, a first portion of the power converter circuit components are mounted on the first surface 46*a* and a second portion of the power converter circuit components are mounted on the second surface 46*b*.

The two-piece magnetic core assembly 48 may be an E-I core or an E-E core. For E-I core, the "I" is placed proximate to the open end of the "E" to form a 3-legged structure. For an E-E core, the corresponding legs of the "E" are placed proximate to each other. The "E"s have comparable height. One of skill in the art would understand that any magnetic core assembly may be positioned in the hole of the stack of circuit layers 46.

For a two-piece E-I or E-E shaped core, the magnetic core assembly 48 has a window. The planar energy transfer element 38 is surrounded by the magnetic core assembly 48 and positioned within the window. The central leg of the E portion extends through the hole of the stack of circuit layers 46.

Figure 4:
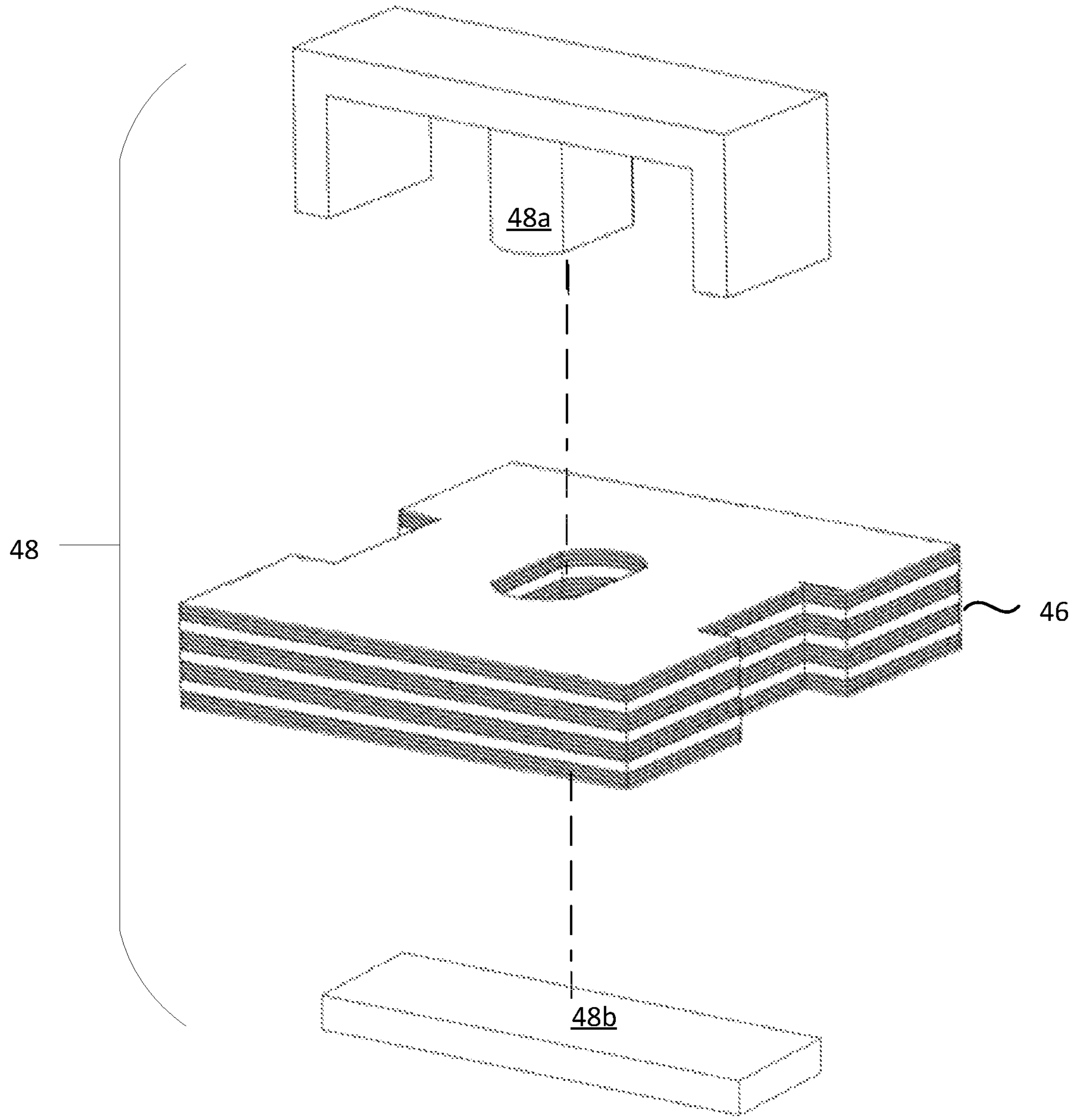
FIG. 4 is an exploded view of the power converter assembly shown in FIGS. 3A and 3B.

FIG. 4 is an exploded view of the magnetic core 48 and the stack of circuit layers 46 shown in FIGS. 3A and 3B. The magnetic core assembly 48 is a two-piece E-I shaped magnetic core having a central leg. The central leg 48*a* is substantially perpendicular to the stack of circuit layers 46 and extends through the hole of the stack of circuit layers 46. When the two pieces of the core are brought together, there is an air gap between the end of the central leg 48*a* and the I portion 48*b* of the core.

Figure 5:
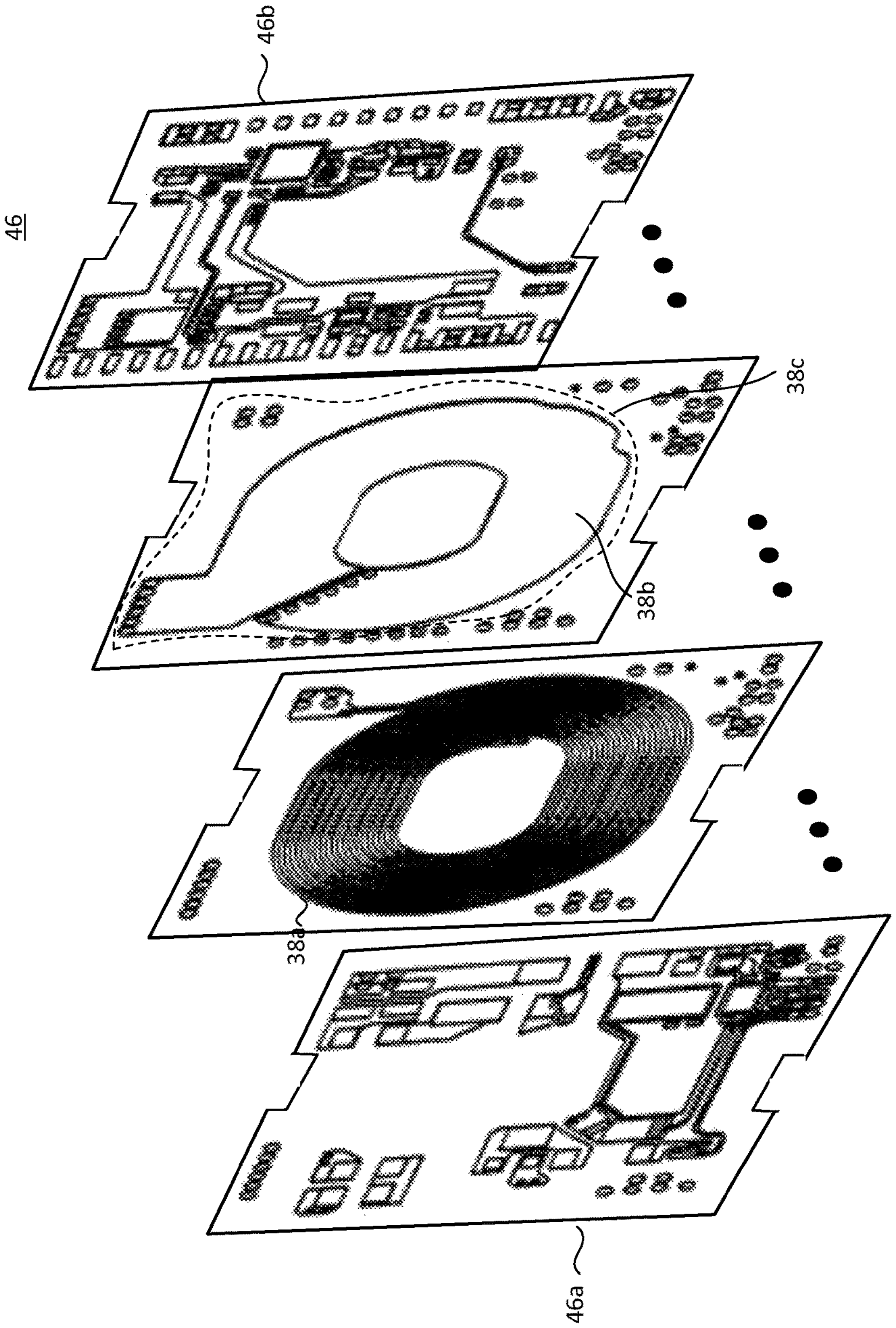
FIG. 5 is an exploded view showing the electrical connectivity layers and winding layers of a simplified stack of circuit layers 46.

FIG. 5 is an exploded view showing the electrical connectivity layers and winding layers of a simplified stack of circuit layers 46. In this embodiment, each circuit layer is a layer of a multi-layer printed circuit board. One of skill in the art would understand that each circuit layer could be formed as an individual printed circuit board, wherein the printed circuit boards are later assembled into the stack.

In this simplified embodiment, the first surface 46*a* and the second surface 46*b* are connectivity layers. A connectivity layer may include copper traces used in the power converter to provide electrical connectivity within the stack 46.

For the input winding layer 38*a* and the output winding layer 38*b*, the winding may be a circular or an oval spiral and therefore may not necessarily run into the corners of the pcb layer. These corners may include connections for electrical connectivity, e.g., pads, vias, and traces, to allow electrical connectivity to the circuit layers. For each type of winding layer, e.g., input and output, there may be multiple layers of windings.

The area 38*c* of the planar energy transfer element is constrained by the circuit feature that occupies the most surface. The area 38*c* of the planar energy transfer element may include the windings and connections for electrical connectivity of the larger of the input and output windings 38*a*, 38*b*. The input and the output windings 38*a*, 38*b* may not occupy the same area because the number of turns (a turn is a revolution about the central hole), the pitch between the turns, or even the cross-sectional area of the conductors that make up the turns may be different. The power circuit components are positioned proximate to and overlapping any of the windings and the associated connections for electrical connectivity.

Each circuit layer may be a printed circuit board or a sublayer in the printed circuit board. Sublayers may include isolation and insulation layers to reduce electromagnetic interference (EMI) noise, to provide stress relief, or to provide electrical isolation between circuit components within the dc-dc converter.

Numerous specific details are set forth above in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention. For example, skilled artisans will appreciate that elements in the previously described figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in the figures in order to facilitate a less obstructed view of these various embodiments of the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality.

The description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that any specific example voltages, currents, frequencies, power range values, times, etc., are provided for explanation purposes and that other values may also be employed in other embodiments and examples in accordance with the teachings of the present invention.

Although the present invention is defined in the claims, the present invention can alternatively be defined in accordance with the following examples:

Example 1. A power converter comprising a stack of circuit layers having a first surface and a hole which extends through each of the circuit layers, a portion of the circuit layers forming an energy transfer element, the energy transfer element comprising an input winding having at least one winding layer and an output winding having at least one winding layer, each winding layer including a winding and connections for electrical connectivity; a magnetic core positioned within the hole substantially perpendicular to the stack; an area of the stack of circuit layers coplanar with the first surface and encompassing the windings and connections for electrical connectivity of the input and output windings; and power converter circuit components mounted on a first surface of the stack, the power converter circuit components comprising, input circuit components mounted within the area of the stack and external to the magnetic core, wherein the input circuit components are electrically connected to the input winding; and output circuit components mounted within the area of the stack and external to the magnetic core, wherein the output circuit components are electrically connected to the output winding.

Example 2. The power converter of example 1, wherein the power converter circuit components are further mounted on a second surface of the stack of circuit layers and the first and second surfaces are substantially parallel to each other.

Example 3. The power converter of example 2, wherein: a first portion of the power converter circuit components are input converter components that are mounted on the first surface, and a second portion of the power converter circuit components are output converter components that mounted on the second surface.

Example 4. The power converter of example 1, wherein a portion of the power converter circuit components is mounted over a portion of the windings of the input winding and the output winding.

Example 5. The power converter of example 4, wherein the portion of the power converter circuit components is further mounted over a portion of the connections for electrical connectivity of the input winding and the output winding.

Example 6. The power converter of example 1, wherein a portion of the power converter circuits components is mounted over a portion of the connections for electrical connectivity of the input winding and the output winding.

Example 7. The power converter of example 1 to 6 further comprising a housing surrounding the stack, the magnetic core, and the power converter circuit components.

Example 8. The power converter of example 1 to 7, wherein the magnetic core is an E-E shaped core.

Example 9. The power converter of example 1 to 7, wherein the magnetic core is an E-I shaped core.

Example 10. The power converter of example 1 to 9, the power converter circuit components comprising a power switch, a synchronous rectifier, a controller, a filter circuit, a sensing circuit, and a feedback circuit.

Example 11. The power converter of example 1 to 10, the stack of circuit layers further comprising each circuit layer being a printed circuit board.

Example 12. The power converter of example 1 to 10, wherein the stack of circuit layers is a multi-layer printed circuit board.

Example 13. A power converter comprising: a magnetic core having a window; a stack of circuit layers positioned within the window, a portion of the circuit layers forming an energy transfer element, the energy transfer element comprising an input winding having at least one winding layer and an output winding having at least one winding layer, each winding layer including a planar winding and connections for electrical connectivity; an area of the stack encompassing the planar windings and connections for electrical connectivity of the input winding and output winding; power converter circuit components mounted on a first surface of the stack and electrically connected to one of the input winding and output winding, wherein the power converter circuit components are mounted within the area of the stack and external to the magnetic core.

Example 14. The power converter of example 13, wherein the power converter circuit components are further mounted on a second surface of the stack and the first and second surfaces are substantially parallel to each other.

Example 15. The power converter of example 14, wherein a portion of the power converter circuit components are mounted over a portion of the windings of the input winding and the output winding.

Example 16. The power converter of example 15, wherein the portion of the power converter circuit components are mounted over a portion of the connections for electrical connectivity of the input winding and the output winding.

Example 17. The power converter of example 13 to 16 further comprising a housing surrounding the stack, the magnetic core, and the power converter circuit components.

Example 18. The power converter of example 13 to 17, the power converter circuit components selected from a group consisting of a power switch, a synchronous rectifier, a controller, a filter circuit, a sensing circuit, and a feedback circuit.

We claim:

1. A power converter comprising:

a stack of circuit layers having a first surface and a hole which extends through each of the circuit layers, a portion of the circuit layers forming an energy transfer element, the energy transfer element comprising an input winding having at least one winding layer and an output winding having at least one winding layer, each winding layer including a winding and connections for electrical connectivity;

a magnetic core positioned within the hole substantially perpendicular to the stack;

an area of the stack of circuit layers encompassing the windings and connections for electrical connectivity of the input and output windings; and power converter circuit components mounted on a first surface of the stack of circuit layers and a second surface of the stack of circuit layers, the first surface and the second surface are substantially parallel to each other, the power converter circuit components comprising:

a first portion of the power converter circuit components are input circuit components mounted on the first surface within the area of the stack and external to the magnetic core, wherein the input circuit components are electrically connected to the input winding; and a second portion of the power converter circuit components are output circuit components mounted on the second surface within the area of the stack and external to the magnetic core, wherein the output circuit components are electrically connected to the output winding.

2. The power converter of claim 1, wherein a portion of the power converter circuit components is mounted over a portion of the windings of the input winding and the output winding.

3. The power converter of claim 1, wherein a portion of the power converter circuits components is mounted over a portion of the connections for electrical connectivity of the input winding and the output winding.

4. The power converter of claim 1 further comprising a housing surrounding the stack, the magnetic core, and the power converter circuit components.

5. The power converter of claim 1, wherein the magnetic core is an E-E shaped core.

6. The power converter of claim 1, wherein the magnetic core is an E-I shaped core.

7. The power converter of claim 1, the power converter circuit components comprising a power switch, a synchronous rectifier, a controller, a filter circuit, a sensing circuit, and a feedback circuit.

8. The power converter of claim 1, the stack of circuit layers further comprising each circuit layer being a printed circuit board.

9. The power converter of claim 1, wherein the stack of circuit layers is a multi-layer printed circuit board.

10. The power converter of claim 2, wherein the portion of the power converter circuit components is further mounted over a portion of the connections for electrical connectivity of the input winding and the output winding.

11. A power converter comprising:

a magnetic core, a stack of circuit layers positioned around a portion of the magnetic core, a portion of the stack of circuit layers forming an energy transfer element, the energy transfer element comprising an input winding having at least one winding layer and an output winding having at least one winding layer, each winding layer including a planar winding and connections for electrical connectivity;

an area of the stack overlapping the planar windings and connections for electrical connectivity of the input winding and the output winding; and power converter circuit components mounted on a first surface of the stack and electrically connected to one of the input winding and output winding, wherein the power converter circuit components are mounted within the area of the stack overlapping the planar windings and external to the magnetic core.

12. The power converter of claim 11, wherein the power converter circuit components are further mounted on a second surface of the stack and the first and second surfaces are substantially parallel to each other, wherein the power converter circuit components mounted on the second surface of the stack are overlapping the planar windings.

13. The power converter of claim 11 further comprising a housing surrounding the stack, the magnetic core, and the power converter circuit components.

14. The power converter of claim 11, the power converter circuit components selected from a group consisting of a power switch, a synchronous rectifier, a controller, a filter circuit, a sensing circuit, and a feedback circuit.

15. The power converter of claim 12, wherein a portion of the power converter circuit components are mounted over a portion of the windings of the input winding and the output winding.

16. The power converter of claim 15, wherein the portion of the power converter circuit components are mounted over a portion of the connections for electrical connectivity of the input winding and the output winding.

* * * * *